Oct. 3, 1950 W. S. WINFIELD 2,524,281

ELECTRICAL AUTOMATIC TUNING UNIT

Filed Oct. 29, 1942 2 Sheets-Sheet 1

INVENTOR

William S. Winfield

BY

C. A. Linton

ATTORNEY

INVENTOR
William S. Winfield
BY
C. A. [signature]
ATTORNEY

Patented Oct. 3, 1950 2,524,281

UNITED STATES PATENT OFFICE 2,524,281

ELECTRICAL AUTOMATIC TUNING UNIT

William S. Winfield, Tonawanda, N. Y., assignor to Colonial Radio Corporation, Buffalo, N. Y.

Application October 29, 1942, Serial No. 463,775

7 Claims. (Cl. 250—40)

This invention relates to automatic tuning of electrical circuits and has particular application to automatic tuning of radio apparatus such as transmitters and receivers. It is of particular utility in providing automatic tuning of aircraft radio apparatus, although it will be understood that it may be applied advantageously in many other installations where automatic tuning is desirable.

Various proposals have been made in the past for providing automatic tuning, of the motor driven type. In most of these, some mechanical element was adjusted so as to stop the operation of the tuning instrumentality when a particular dial setting corresponding to that of the desired frequency was reached. This involved not only the necessity of careful adjustment of the mechanical elements, in setting up the apparatus initially, but also careful checking and maintenance to make sure that mechanical misadjustments or misalignments did not throw one or more circuits off tune. Apparatus of this type usually was complicated and required considerable time to adjust and maintain, and the results were not too satisfactory at best.

In accordance with this invention, I provide a purely electrically controlled tuner, preferably using crystal oscillators or other master oscillators, the frequencies of which are set by the frequency determining element, such as the crystal. In most applications of my invention there will be provided several frequency fixing elements. For instance, if a transmitter or receiver is designed to operate on one of six channels, I may provide a multiple crystal oscillator arranged to receive six crystals, each chosen to provide one of the frequencies desired, and some form of selecting switch so that the operator may select the channel to which he wishes to tune. A variable tuning instrument, such as a gang condenser or gang variometer, may be provided for tuning all of the circuits required to be tuned, and power means, such as a motor, may be provided to operate the tuner.

In accordance with my invention, some circuit which is variably tuned is established as the controlling circuit and a determination may be made of the current output from this circuit which constitutes desired operation. I provide a relay operatively associated with this circuit, controlling the variation of the tuning instrumentality to stop the movement thereof when the desired energy level is being delivered from the controlling circuit. In operation, the operator has only to operate a switch for the channel desired, whereupon the motor will be set into operation, the tuning of the apparatus will be varied until it is tuned to the desired frequency and is delivering the desired output energy, at which point, without any further action by the operator, the movement of the tuning instrumentality is stopped, and the apparatus remains tuned to the desired channel.

Among the objects of my invention may be mentioned:

To provide automatic tuning apparatus in which no adjustment is required to recalibrate the apparatus for new frequency channels.

To provide automatic tuning apparatus which is simple, positive, and reliable in operation.

To provide automatic tuning apparatus which is free from mechanical selector parts requiring close adjustment and careful maintenance.

To provide automatic tuning apparatus which may be incorporated in radio receivers and transmitters by the addition of a relatively small number of parts of little weight, small bulk, and requiring little in the way of maintenance.

Still other objects of my invention will be apparent from the specification.

Figure 1:
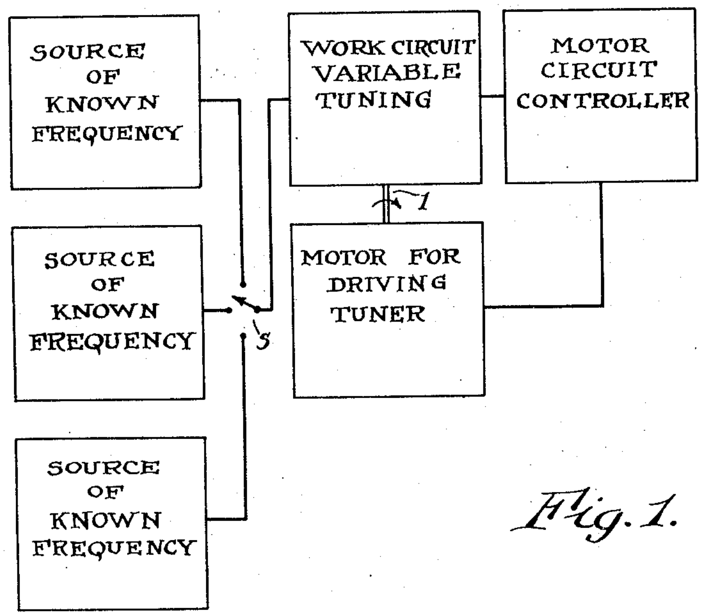
Fig. 1 is a block diagram illustrating the principles of my invention.

Referring now more particularly to Fig. 1, I have shown three separate sources of known frequency. These may, for example, be piezoelectric crystals, one crystal, for example, oscillating on a first frequency, the second crystal on a second frequency, and the third on a third frequency. While these sources may be crystals, they may be oscillators of other types oscillating on a fixed and invariable frequency.

These are associated with a work circuit having variable tuning, and a switch S may be provided for selectively connecting any desired frequency source to the work circuit. The work circuit is provided with a variable tuning element, such as a variable condenser or variometer, arranged to be driven by a suitable motor through shaft 1. Preferably the variable tuning element is arranged for continuous variation in one direction, and will continuously traverse the entire tuning range of the circuit. The work circuit is of the type which will not deliver output until it is excited by a source, and when so excited, delivers oscillations of only the source frequency. A motor circuit controller is associated with the output of the work circuit so that when a predetermined level of energy is delivered by the work circuit, the motor circuit controller operates to stop the movement of the variable tuning element.

Thus the operator, in case he wishes the circuit to operate on frequency F1, will set the switch S for that particular frequency, whereupon, if the circuit is not tuned to that frequency, the motor will begin to drive the tuning element. No output will be delivered by the work circuit until the variable tuning element reaches such a position that the work circuit is tuned to the selected frequency. When this position is reached, the work circuit begins to deliver energy and if this energy is equal to the predetermined value, the motor circuit controller operates and stops the movement of the tuner, and the circuit will remain tuned at the desired frequency as long as it continues to deliver the desired amount of energy, or until the operator moves the switch S to select a different frequency, whereupon the circuit will be tuned to the new frequency as above described. In case it is desired to recalibrate the apparatus for a new frequency or frequencies within the range of the apparatus, it is only necessary to remove the crystals from their sockets and insert a different crystal or crystals, of the frequency or frequencies desired. The time-consuming operation of recalibration, which formerly required a skilled operator and complicated test equipment, is entirely eliminated.

Figure 2:
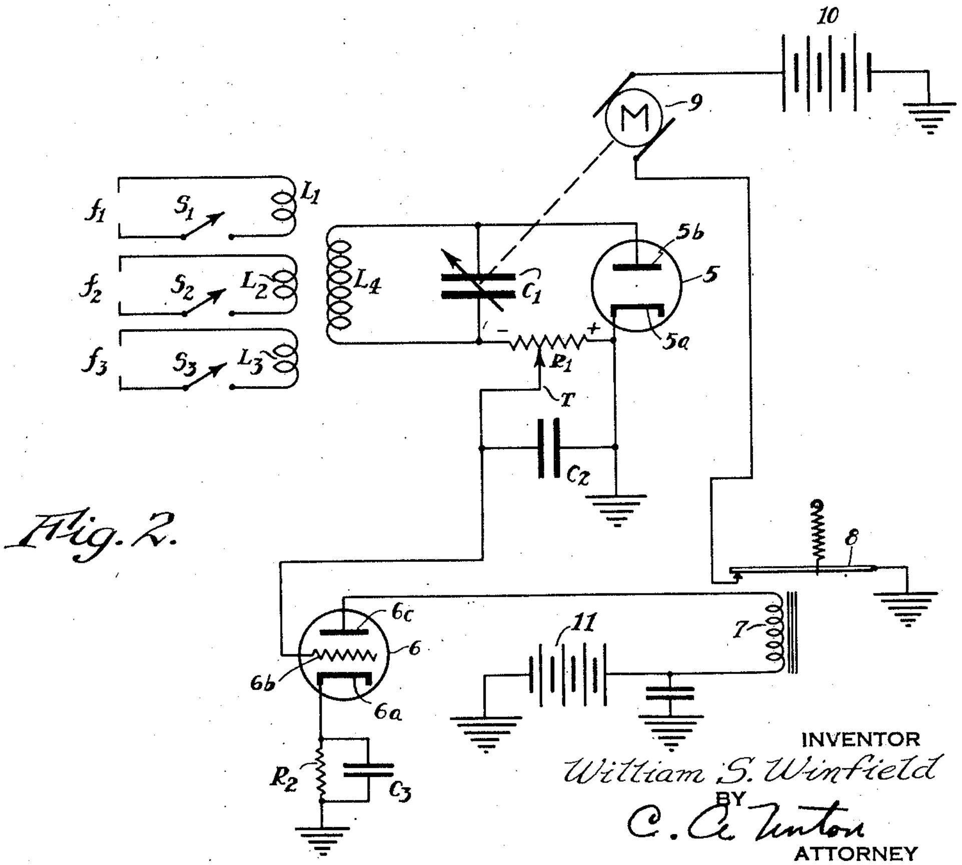
Fig. 2 is a simplified circuit diagram illustrating the application of my invention to provide automatic tuning over three channels in a single tuned circuit.

Referring more particularly now to Fig. 2, this is a circuit diagram showing the invention applied to tuning a single circuit, which may be any circuit desired. It may, for example, be an antenna circuit of a transmitter or receiver. In this instance *f1*, *f2*, and *f3* indicate sources of oscillations of three different frequencies. These sources may be crystals or other suitable and well-known elements. Each may be coupled to the tuned circuit through coils L1, L2, and L3 respectively by the closure of the respective switches S1, S2, and S3. The tuned circuit may comprise the inductance L4 tuned by condenser C1.

Parallel with condenser C1 I may provide a diode 5 having cathode 5*a* and anode 5*b*. Resistance R1 may be interposed between the cathode lead and the connection to the condenser C1. Adjustable tap T may be provided to connect to any desired point on the resistance R1 and bypass condenser C2 may be connected from this tap to the cathode lead, which may be grounded as indicated. Control tube 6 may comprise cathode 6*a*, control electrode 6*b* and anode 6*c*, and the cathode may be connected to ground through resistance R2 shunted by condenser C3 and the tap T may be connected to the control electrode 6*b*.

Plate voltage may be supplied by a suitable source 11 through relay winding 7, which may serve, when energized, to keep the relay armature 8 in closed position against a suitable bias. The relay armature 8 completes the circuit of the motor 9 through a suitable power source 10. The motor 9 in turn is connected as indicated by the dotted line, to operate the variable condenser C1, which is preferably arranged to admit of continuous rotation through any number of complete revolutions. Preferably, but not necessarily, a clutch of any desired type may be incorporated in the motor 9 so that when the motor circuit is opened, the motor is disconnected from the condenser shaft. The value of resistances R2 and R1, and the amount of the plate voltage applied to tube 6 is preferably so chosen that when no current is flowing in the circuit L4—C1, the space current of tube 6 is sufficient to maintain relay armature 8 in circuit closing position against its bias, and the value of resistance R1 is so chosen that the rectified current flowing therein through the diode 5 is sufficient to bias the tube 6 to cut-off, or to reduce the plate current sufficiently to permit the armature 8 to be opened.

By adjustment of the tap T on the proper point of resistor R1, the action of the circuit can be very precisely controlled, movement of the tap to the left causing plate current cut-off at a lower current and movement to the right increasing the amount of current required to effect cut-off. The operation of this circuit, it is believed, will be clear from what has already been said.

If the operator wishes the circuit to be tuned to frequency F1, assuming the apparatus is in operating condition (the necessity On and Off switches, not shown, having been placed in condition for operation), he will close switch S1. If the circuit is not tuned to the desired frequency, no current will be generated in the circuit L4—C1, no bias other than the normal bias will be applied to the tube 6, plate current will flow, the armature 8 will be closed, the motor circuit will be energized, and the motor will drive tuning condenser C1.

When the circuit comes into tune with frequency F1, current of this frequency will begin to flow, building up a uni-directional potential across resistance R1, having the polarity indicated. When this reaches a value sufficient to cut off plate current in the tube 6, the armature 8 will be opened and the circuit will remain in tune as long as the current flow is sufficient to maintain the cut-off bias on tube 6. Should the operator desire to change to another channel, he will open switch S1 and close switch S2 or switch S3, as the case may be, and the operation will be as before described, the circuit being tuned to the new frequency.

Figure 3:
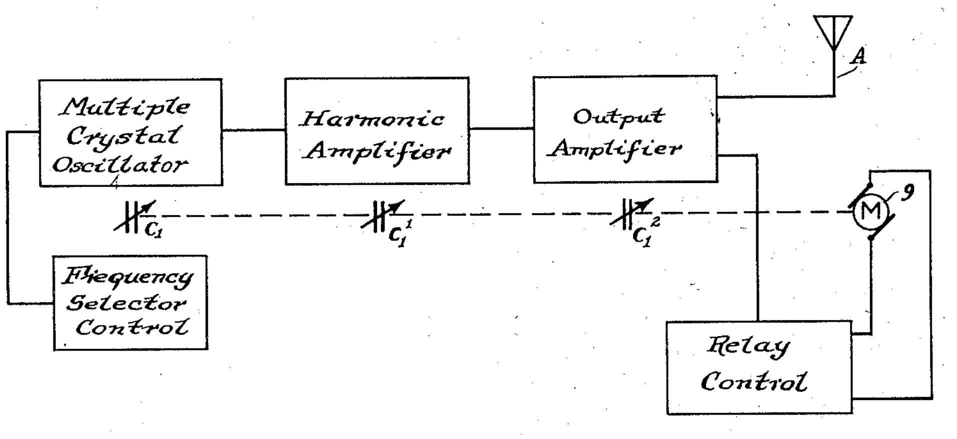
Fig. 3 is a simplified diagram showing the application of my invention in a radio transmitter.

Referring now more particularly to Fig. 3, I have indicated in simplified form a transmitter with my invention applied thereto. In this instance, the transmitter may comprise a multiple oscillator, as already described, having a frequency selector control for selecting the channel to which the transmitter is to be tuned. The output of the oscillator may be passed to an amplifier and in the case of high frequency transmitters this may be what is known as a harmonic amplifier or frequency multiplier, the output of which may be supplied to the final output amplifier, which in turn feeds the antenna A.

The oscillator, amplifier, and output amplifier may be tuned by a gang tuning instrumentality, such as gang condenser, having sections C1, $C1^1$, and $C1^2$, driven by motor 9. The output amplifier may feed the relay control, such as diode 5, resistor R1, and tube 6, as indicated in Fig. 2. The relay control in turn controls the circuit of motor 9. Operation of this arrangement, insofar as the automatic tuning control is concerned, is substantially the same as for Fig. 2, the operator selecting the frequency channel in which it is desired to operate, and the motor circuit then being closed by the relay control. The oscillator, amplifier, and output amplifier will all be simultaneously tuned until the desired frequency output reaches the predetermined energy level, at which time the relay control will operate to stop further change of tuning in all three circuits. The transmitter will remain on the desired frequency until the operator selects another frequency.

Figure 4:
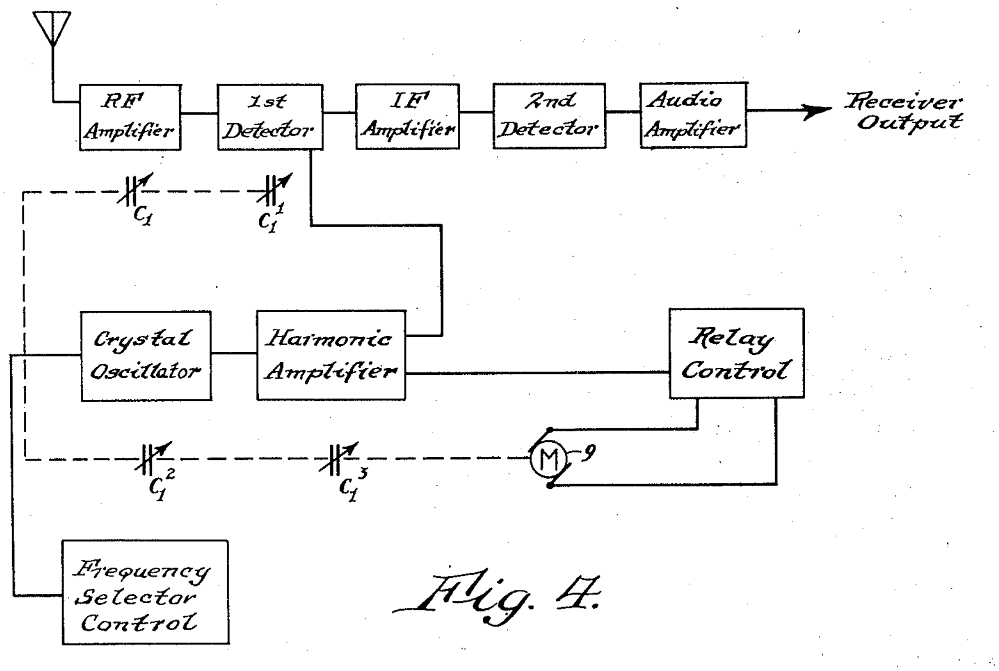
Fig. 4 is a similar diagram showing the same as applied to a radio receiver.

Referring now more particularly to Fig. 4, I have shown my invention as applied to a receiver of the well-known superheterodyne type comprising a radio frequency amplifier, first detector, intermediate frequency amplifier, second detector, audio-amplifier, and output circuit of any suitable type to render the signals intelligible. In this instance, as before, there may be provided a crystal oscillator or other suitable oscillator or oscillators of constant frequency provided with a frequency selective control, by means of which the operator can select the oscillator frequency and thereby tune to the desired channel. The oscillator may supply an amplifier, which in the case of an ultra-high frequency receiver may be a harmonic amplifier or frequency multiplier, and the output of this in turn may be applied to the first detector. A portion of the output from the oscillator, before or after passing through the amplifier, may be supplied to the relay control; again, for example, such as shown in Fig. 2, this relay control controlling the circuit of motor 9, driving the tuning instrumentality, which in this instance may be a gang variable condenser having a section C1 tuning the RF amplifier, $C1^1$ the first detector, $C1^2$ the crystal oscillator, and $C1^3$, the amplifier.

The operation of this circuit, insofar as the tuning control is concerned, is the same as those previously described. If the operator wishes to receive signals of frequency F1, he will operate the frequency selector control to select this frequency. If the oscillator is not tuned to the proper value to give beat frequencies from the desired channel, the circuit of motor 9 will be closed by the relay control, and the oscillator tuning will be varied by operation of the tuning condenser. At the same time the other circuits will be tuned to the proper values to correspond.

When the oscillator is tuned to the desired frequency, current begins to flow in the diode 5. and when this current reaches a predetermined value, the relay control stops the variation in tuning, and the receiver remains tuned to the desired channel until the operator manipulates the frequency selector control to set the receiver for a different channel.

In practical operation of apparatus according to my invention, it has been found desirable not to set the relay control for the maximum current that can be obtained under best conditions, because any slight loss of efficiency might cut down the current output to a value insufficient to operate the relay control, in which case the motor would continue to operate and the tuner would pass over the desired frequency. I prefer to set the relay control for a value sufficiently less than the maximum current to assure that there will always be sufficient current to operate the relay control. Also, it will be preferable to interpose a considerable mechanical step down ratio between the motor and the tuning shaft to prevent too fast operation of the tuning shaft and to prevent harmful overrun after the current has reached the value to operate the relay control.

In this application I have particularly pointed out and distinctly claimed the part, improvement, or combination which I claim as my invention or discovery, and I have explained the principles thereof and the best mode in which I have contemplated applying those principles, so as to distinguish my invention from other inventions.

While I have shown and described certain preferred embodiments of my invention, it will be understood that modifications and changes may be made without departing from the spirit and scope of my invention, as will be clear to those skilled in the art.

I claim:

1. An automatic tuning system comprising: a tunable wave-signal translating channel requiring, both during and after each tuning operation, excitation from a local excitation source by which to effect selective translation of a desired wave-signal which provides signal communication; at least one tunable resonant circuit, which requires excitation with but independently of said channel and has a variable tuning element, for establishing control of the selective translation frequency of said channel; a local frequency determining source coupled to said channel and to resonant circuit to furnish said required excitations both during and after completion of said each tuning operation to effect translation by said channel of said desired wave signal, the frequency of said source having a value which is selectable independently of said control of the selective translation frequency of said channel; motor means for varying said tuning element; and a control system responsive to the level of energy developed in said resonant circuit by the independent excitation thereof from said source for controlling said motor means to stop the variation of said tuning element by said means in response to the development in said resonant circuit of a predetermined level of energy at a frequency determined by said source, whereby the selective translation frequency of said channel is established by the selectable frequency of said source.

2. An automatic tuning system comprising: a tunable wave-signal amplifier requiring excitation, both during and after each tuning operation, selectively to translate a desired wave-signal which provides signal communication; said amplifier including a plurality of cascade tunable resonant circuits, at least one of which is excited with said amplifier and has a variable tuning element, for controlling the selective translation frequency of said amplifier; a local frequency-determining source coupled to said amplifier to furnish said required excitation both during and after completion of said each tuning operation to effect translation by said amplifier of said desired wave signal, the frequency of said source having a value which is selectable independently of said control of the selective translation frequency of said amplifier; motor means for varying said tuning element and simultaneously therewith the tuning of said plurality of resonant circuits; and a control system responsive to the level of energy developed in said one resonant circuit by the excitation thereof from said source for controlling said motor means to stop the variation of said tuning by said means in response to the development in said one resonant circuit of a predetermined level of energy at a frequency determined by said source, whereby the selective translation frequency of said amplifier is established by the selective frequency of said source.

3. An automatic tuning system comprising: a tunable wave-signal translating channel requiring excitation, both during and after each tuning operation, selectively to translate a desired wave-signal which provides signal communication; said channel including at least one tunable resonant circuit, which is excited with said channel and has a variable tuning element, for controlling the selective translation frequency of said channel; a local oscillator including piezoelectric-frequency-control means and a variable tuning element and being coupled to said channel to furnish said required excitation both during and after completion of said each tuning operation to effect translation by said channel of said desired wave signal, the frequency of said oscillator having a value which is selectable by selection of the frequency of said piezoelectric means independently of said control of the selective translation frequency of said channel; motor means for simultaneously varying said tuning elements; and a control system responsive to the level of energy developed in said resonant circuit by the excitation thereof from said source for controlling said motor means to stop the variation of said tuning elements by said means in response to the developement in said resonant circuit of a predetermined level of energy at a frequency determined by said source, whereby the selective translation frequency of said channel is established by the selectable frequency of said source.

4. An automatic tuning system comprising: a tunable wave-signal translating channel requiring excitation, both during and after each tuning operation, selectively to translate a desired wave-signal which provides signal communication; said channel including at least one tunable resonant circuit, which is excited with but independently of said channel and has a variable tuning element, for controlling the selective translation frequency of said channel; a local frequency-determining source coupled to said channel to furnish said required excitations both during and after completion of said each tuning operation to effect translation by said channel of said desired wave signal, the frequency of said source having a value which is selectable independently of said control of the selective translation frequency of said channel; motor means for varying said tuning element; and a control system including a rectifier network coupled across said resonant circuit and responsive to the energy level developed therein by the independent excitation thereof from said source for controlling said motor means to stop the variation of said tuning element by said means in response to the development in said resonant circuit of a predetermined level of energy at a frequency determined by said source, whereby the selective translation frequency of said channel is established by the selectable frequency of said source.

5. An automatic tuning system comprising: a tunable wave-signal translating channel requiring excitation, both during and after each tuning operation, selectively to translate a desired wave-signal which provides signal communication; said channel including at least one tunable resonant circuit, which is excited with but independently of said channel and has a variable tuning element, for controlling the selective translation frequency of said channel; a local frequency-determining source coupled to said channel to furnish said required excitations both during and after completion of said each tuning operation to effect translation by said channel of said desired wave signal, the frequency of said source having a value which is selectable independently of said control of the selective translation frequency of said channel; motor means for varying said tuning element; a rectifier system coupled to said resonant circuit to develop a unidirectional potential having an amplitude varying with the energy level developed in said resonant circuit by the independent excitation thereof from said source; and a control system responsive to said unidirectional potential for controlling said motor means to stop the variation of said tuning element by said means in response to the development in said resonant circuit of said predetermined level of energy at a frequency determined by said source, whereby the selective translation frequency of said channel is established by the selectable frequency of said source.

6. An automatic tuning system comprising: a tunable wave-signal translating channel requiring excitation, both during and after each tuning operation, selectively to translate a desired wave-signal which provides signal communication; said channel including at least one tunable resonant circuit, which is excited with said channel and has a variable tuning element, for controlling the selective translation frequency of said channel; a local frequency-determining source including a variable tuning element and being coupled to said channel to furnish said required excitation both during and after completion of said each tuning operation to effect translation by said channel of said desired wave signal, the frequency of said source having a value which is selectable independently of said control of the selective translation frequency of said channel; a motor for varying said tuning elements and including a motor-energizing circuit; a rectifier system coupled to said resonant circuit to develop a unidirectional potential having an amplitude varying with the energy level developed in said resonant circuit by the excitation thereof from said source; a control tube coupled to said rectifier system to have the conductivity of said tube controlled by said developed unidirectional potential; and a relay responsive to a predetermined condition of conductivity of said control tube for controlling said energizing circuit to deenergize said motor means and stop the variation of said tuning elements by said means in response to the development in said resonant circuit of a predetermined level of energy at a frequency determined by said source, whereby the selective translation frequency of said channel is established by the selectable frequency of said source.

7. An automatic tuning system comprising: a tunable wave-signal translating channel requiring excitation, both during and after each tuning operation, selectively to translate a desired wave-signal which provides signal communication; said channel including a plurality of cascade tunable resonant circuits, a tunable resonant circuit which is excited with said channel and has a variable tuning element for controlling the selective translation frequency of said channel; a source of local oscillations having a plurality of preselectable frequencies each controlled by piezoelectric means and being coupled to said channel and last-mentioned resonant circuit to furnish said required excitations both during and after completion of said each tuning operation to effect translation by said channel of said desired wave signal, means for selectably controlling said piezoelectric means to establish the frequency of said source independently of said control of the selective translation frequency of said channel; motor means for varying said tuning element and simultaneously therewith the tuning of said plurality of resonant circuits; and a control system responsive to the level of energy developed in said last-mentioned resonant circuit by the excitation thereof from said source for controlling said motor means to stop the variation of said tuning element by said means in response to the development in said resonant circuit of a predetermined level of energy at a frequency determined by said source, whereby the selective translation frequency of said channel is established by the selectable frequency of said source.

WILLIAM S. WINFIELD.

REFERENCES CITED

The following references are of record in the file of this patent:

UNITED STATES PATENTS

| Number | Name | Date |
|---|---|---|
| 1,578,296 | Taylor | Mar. 30, 1926 |
| 1,771,375 | Byrnes | July 22, 1930 |
| 1,781,268 | Chubb | Nov. 11, 1930 |
| 1,792,276 | Chubb | Feb. 10, 1931 |
| 1,912,322 | Taylor | May 30, 1933 |
| 2,011,953 | Somers | Aug. 20, 1935 |
| 2,056,200 | Lowell | Oct. 6, 1936 |
| 2,076,361 | Beberage | Apr. 6, 1937 |
| 2,078,060 | Clement | Apr. 20, 1937 |
| 2,083,105 | Weber | June 8, 1937 |
| 2,111,665 | Hansell | Mar. 22, 1938 |
| 2,186,068 | Hammond et al. | Jan. 9, 1940 |
| 2,190,782 | Hansell | Feb. 20, 1940 |
| 2,247,455 | Turin et al. | July 1, 1941 |
| 2,262,218 | Andrews | Nov. 11, 1941 |
| 2,262,766 | Jansson | Nov. 18, 1941 |
| 2,462,856 | Ginzon | Mar. 1, 1949 |

FOREIGN PATENTS

| Number | Country | Date |
|---|---|---|
| 356,726 | Great Britain | Sept. 2, 1931 |
| 425,626 | Great Britain | Mar. 19, 1935 |
| 702,332 | Germany | Feb. 5, 1941 |